United States Patent
Kakkad

(10) Patent No.: US 7,465,614 B2
(45) Date of Patent: Dec. 16, 2008

(54) METHOD OF FABRICATING SEMICONDUCTOR DEVICE AND SEMICONDUCTOR FABRICATED BY THE SAME METHOD

(75) Inventor: Ramesh Kakkad, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 345 days.

(21) Appl. No.: 11/083,225

(22) Filed: Mar. 18, 2005

(65) Prior Publication Data
US 2006/0017052 A1    Jan. 26, 2006

(30) Foreign Application Priority Data
Jul. 22, 2004   (KR)   .............. 10-2004-0057382

(51) Int. Cl.
   *H01L 21/84* (2006.01)
(52) U.S. Cl. ............... 438/151; 257/288; 257/E21.347; 257/E21.475; 257/E21.596; 438/308; 438/293; 438/149
(58) Field of Classification Search .......... 438/29, 438/69, 82, 30, 48, 128, 149, 151, 157, 293, 438/308, 288; 257/57, 59, 72, 83, 257, 290, 257/351, 368, 288, 40, 642, 759, E21.347, 257/E21.475, E21.596
See application file for complete search history.

(56) References Cited

U.S. PATENT DOCUMENTS 6,501,097 B1 *  12/2002  Zhang ................. 257/72

2005/0029593 A1 *  2/2005  Kudo et al. ............ 257/347

FOREIGN PATENT DOCUMENTS

| JP | 63-304670 | 12/1988 |
|---|---|---|
| JP | 5-21463 | 1/1993 |
| JP | 7-231098 | 8/1995 |
| JP | 08-330598 | 12/1996 |
| JP | 09-213630 | 8/1997 |
| JP | 11-261078 | 9/1999 |
| KR | 1995-9981 | 4/1995 |
| KR | 1997-8658 | 2/1997 |

OTHER PUBLICATIONS

Nam, K. et al., Thin film Transistors with Polycrystalline Silicon Prepared by a New Annealing Method, 1993, Jpn. J. Appl. Phys. vol. 32, pp. 1908-1912.*
Korean Office action for Korean Patent Application No. 10-2004-0057382 issued on Apr. 27, 2006.
Japanese Office action corresponding to Japanese Patent Application No. 2005-081918, issued on Jul. 10, 2007.

* cited by examiner

*Primary Examiner*—Carl Whitehead, Jr.
*Assistant Examiner*—Sonya D McCall Shepard
(74) *Attorney, Agent, or Firm*—Robert E. Bushnell, Esq.

(57) ABSTRACT

A semiconductor device and method of fabricating the same are provided. The method includes: depositing a silicon layer containing amorphous silicon on a substrate; partially crystallizing the amorphous silicon by applying an annealing process to the silicon layer under an atmosphere of $H_2O$ at a predetermined temperature; forming a polycrystalline silicon layer by applying an laser annealing process to the partially crystallized amorphous silicon layer; forming a gate insulating layer on the polycrystalline silicon layer; and forming a gate electrode on the gate insulating layer, so that a substrate is prevented from being bent due to high temperature crystallization while the amorphous silicon is crystallized through an SPC process, thereby reducing defects of the thin film transistor.

20 Claims, 6 Drawing Sheets

METHOD OF FABRICATING SEMICONDUCTOR DEVICE AND SEMICONDUCTOR FABRICATED BY THE SAME METHOD

CLAIM OF PRIORITY

This application makes reference to, incorporates the same herein, and claims all benefits accruing under 35 U.S.C. §119 from an application for METHOD OF FABRICATING A SEMICONDUCTOR DEVICE AND A SEMICONDUCTOR FABRICATED BY THE SAME METHOD earlier filed in the Korean Intellectual Property Office on 22 Jul. 2004 and there duly assigned Serial No. 2004-0057382.

BACKGROUND OF THE INVENTION

1. Field of the Invention

The present invention relates to a method of fabricating a semiconductor device and a semiconductor device fabricated by the same method, and more particularly, to a method of fabricating a semiconductor device which is capable of crystallizing polycrystalline silicon with excellent crystallinity and preventing a substrate from being bent due to a high crystallization temperature upon crystallization, and a semiconductor device fabricated by the same method.

2. Description of the Related Art

Polycrystalline silicon is used in an active device for an organic light emitting display device, normally, thin film transistors (TFTs), which is used to supply current to pixel regions and peripheral driving regions.

In general, the polycrystalline silicon is formed by crystallization of amorphous silicon.

Normally, methods for the crystallization may be largely classified into a low-temperature crystallization method and a high-temperature crystallization method depending on a crystallization temperature, for example, with reference to about 500° C.

An excimer laser annealing (ELA) method using an excimer laser is mainly used as the low-temperature crystallization method. The excimer laser annealing method may use a glass substrate since it is carried out at a crystallization temperature of about 450° C. However, manufacturing cost is high and the substrate is constrained in an optimal size, thereby increasing total cost to fabricate a display device.

The high-temperature crystallization method includes a solid phase crystallization method, a rapid thermal annealing method, and the like. A low-cost annealing method is widely used as the high-temperature crystallization method.

However, since the solid phase crystallization method requires heating at a temperature of more than 600° C. for 20 or more hours for crystallization, many crystal defects are included in the crystallized polycrystalline silicon. Accordingly, sufficient electric field mobility cannot be obtained, the substrate is prone to deform during an annealing process, i.e., a heat treatment process, and lowered crystallization temperature degrades productivity. Because the solid phase crystallization method is also performed at high crystallization temperature, the glass substrate is not allowed to use.

Meanwhile, although the rapid thermal annealing (RTA) method may be accomplished in relatively short time, the substrate is prone to deform due to severe thermal shock and the crystallized polycrystalline silicon has poor electrical characteristics.

Consequently, a low-cost high-temperature annealing method may be required to be used upon the crystallization in order to reduce cost to fabricate the active device. Moreover, there is a need for a high-temperature annealing method using an inexpensive glass substrate, by which the glass substrate is not bent and crystallinity is excellent.

Meanwhile, a method of fabricating a semiconductor device has been disclosed in Korean Patent Publication No. 1997-8658, which includes: depositing an amorphous silicon layer on a substrate; crystallizing the amorphous silicon layer using a laser annealing method; forming an impurity region on the crystallized polycrystalline silicon layer; and activating the impurity region using an RTA process.

Further, a method of fabricating a semiconductor device has been disclosed in Korean Patent Publication No. 1995-9981, which includes: crystallizing an amorphous silicon layer by 50% or less by etching the amorphous silicon layer formed on a substrate and at the same time annealing the amorphous silicon layer; and crystallizing the amorphous silicon layer again using an RTA process, thereby fabricating a polycrystalline silicon thin layer crystallized by 90% or more.

However, in the foregoing conventional methods, the RTA process for activating the impurity region is generally performed at a very high temperature of 700° C. to 950° C. (e.g. 1,000° C. or more in the case of Korean Patent Publication No. 1995-9981), so that the substrate is likely to be deformed.

SUMMARY OF THE INVENTION

The present invention, therefore, solves aforementioned problems associated with conventional devices by providing a method of fabricating a semiconductor device which is capable of crystallizing polycrystalline silicon with excellent crystallinity included in the semiconductor device and preventing a substrate from being bent due to a high annealing temperature during crystallization, and a semiconductor device employing the polycrystalline silicon fabricated by the same method.

In an exemplary embodiment of the present invention, a method of fabricating a semiconductor device includes: depositing a silicon layer comprising amorphous silicon on a substrate; partially crystallizing the amorphous silicon by applying an annealing process to the silicon layer under an atmosphere of $H_2O$ at a predetermined temperature; forming a polycrystalline silicon layer by applying an laser annealing process to the partially crystallized amorphous silicon layer; forming a gate insulating layer on the polycrystalline silicon layer; and forming a gate electrode on the gate insulating layer.

In an exemplary embodiment of the present invention, a method of fabricating a semiconductor device includes: depositing a silicon layer comprising amorphous silicon on a substrate; forming a polycrystalline silicon layer by crystallizing the amorphous silicon into polycrystalline silicon through an annealing process performed under an atmosphere of $H_2O$ at a predetermined temperature; forming an impurity region on the polycrystalline silicon layer; and recrystallizing the polycrystalline silicon layer by applying a laser annealing process to the impurity region.

In yet another exemplary embodiment of the present invention, a semiconductor device fabricated by the foregoing methods includes a polycrystalline silicon thin layer having a Raman spectrum FWHM of 7.5 $cm^{-1}$ or less.

The semiconductor device may be used for an organic light emitting display or a liquid crystal display.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
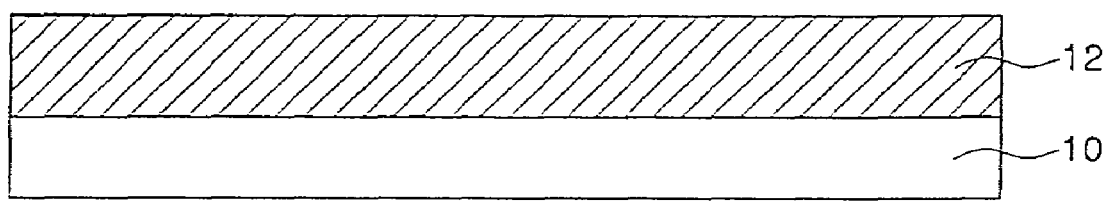
FIGS. 1A to 1E sequentially illustrate a method of fabricating a semiconductor device according to a first embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIGS. 1A to 1E sequentially illustrate a method of fabricating a semiconductor device according to a first embodiment of the present invention.

Referring to FIG. 1A, amorphous silicon or a silicon layer 12 comprising a great quantity of amorphous silicon is deposited on a substrate 10. Here, the substrate 10 is generally formed of a transparent glass substrate.

Further, the silicon layer 12 may be deposited by a typical deposition method such as a plasma enhanced chemical vapor deposition (PECVD) method, a low-pressure chemical vapor deposition (LPCVD) method, or the like.

Additionally, a buffer layer such as a silicon nitride (SiNx) layer or a silicon oxide ($SiO_2$) layer may be interposed between the substrate 10 and the amorphous silicon layer 12 prior to depositing the amorphous silicon layer, in order to prevent contaminants or the like created in the substrate from diffusing into the silicon layer 12 or enhance interfacial characteristics between the silicon layer 12 and the substrate 10.

Figure 1B:
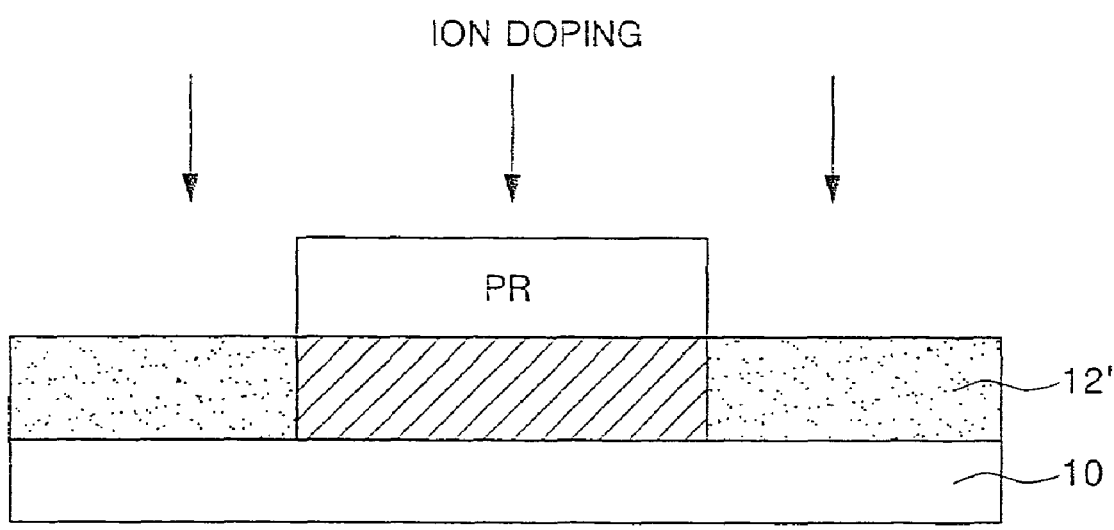

Then, as shown in FIG. 1B, the amorphous silicon or the silicon layer 12 comprising a great quantity of amorphous silicon is annealed. When the silicon layer 12 is heated, the amorphous silicon is melted and cooled, thereby being partially crystallized into the polycrystalline silicon.

For example, the partial crystallization percentage of the amorphous silicon layer preferably ranges from 30% to 80% (i.e., non-crystallization percentage of the amorphous silicon layer ranges from 20% to 70%), and more preferably ranges from 40% to 70% (i.e., non-crystallization percentage of the amorphous silicon layer ranges from 30% to 60%). On the other hand, when the amorphous silicon layer is entirely crystallized by the annealing process, more annealing time and high annealing temperature are required, and thus the substrate is likely to be bent due to the continuous high temperature.

In this embodiment, the annealing process is performed by a general high temperature annealing process such as a rapid thermal annealing (RTA) process, but is performed under an atmosphere of $H_2O$ contrary to the conventional annealing process performed under an atmosphere of $N_2$ or $O_2$.

The annealing process performed under the atmosphere of $H_2O$ shortens annealing time under a condition of the same temperature and reduces annealing temperature under a condition of the same time, compared to the conventional annealing process performed under the atmosphere of $N_2$ or $O_2$.

In particular, according to an embodiment of the present invention, the annealing temperature is lowered, thereby solving the problem that an insulating and transparent substrate such as glass is conventionally deformed due to the high temperature.

According to an embodiment of the present invention, the annealing temperature preferably ranges from 550° C. to 750° C., and more preferably ranges from 600° C. to 710° C. When the annealing temperature is 550° C. or less, the crystallization is not accomplished. Also, when the annealing temperature is 750° C. or more, the substrate is easily deformed. On the other hand, when the annealing temperature is in the range of 600° C. to 710° C., the excellent polycrystalline silicon is obtained because of the proper annealing time.

Meanwhile, $H_2O$ pressure is preferably in the range of 10,000 Pa to 2 Mpa. Here, crystallization rate is proportional to the $H_2O$ pressure. In the case of too low pressure, the crystallization rate is decreased and thus the annealing time is increased, thereby badly affecting the substrate. In the case of too high pressure, there is a risk of explosion. Hence, it is preferable that the $H_2O$ pressure is in the range of 10,000 Pa to 2 Mpa.

Meanwhile, it is preferable to deposit the silicon layer 12 to a thickness of less than 2,000 Å. Small thickness facilitates crystallization. However, too small thickness may affect the device characteristics when the polycrystalline silicon is used to form a thin film transistor. Accordingly, it is more preferable to deposit the silicon layer to a thickness of 300 to 1,000 Å.

Alternatively, after depositing the amorphous silicon layer 12, a region of the amorphous silicon layer 12, to which source and drain regions 100a and 100b are to be formed, may be doped with impurity ions using photoresist, thereby forming a doped amorphous silicon layer 12'.

Figure 1C:
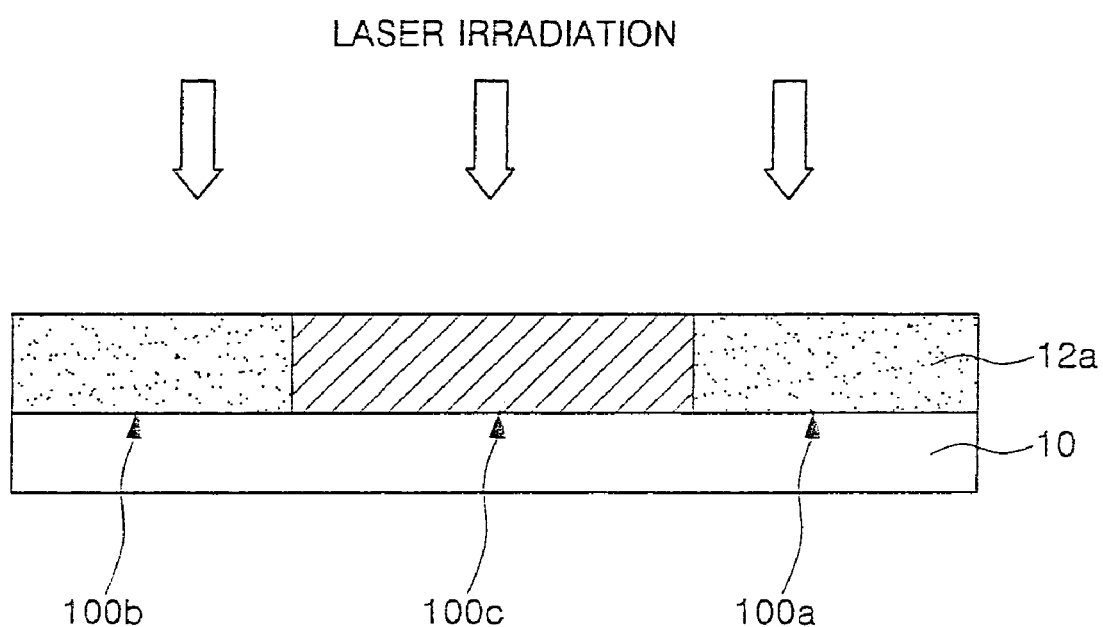

Then, as shown in FIG. 1C, the non-crystallized amorphous silicon layer is crystallized by a laser annealing method such as an excimer laser annealing (ELA) process, thereby forming a polycrystalline silicon layer 12a.

Here, a laser beam of the ELA process has an energy density of 200 $mJ/cm^2$ or more, and preferably has an energy density ranging from 200 to 350 $mJ/cm^2$.

In this case, the injected impurity ions are activated while the amorphous silicon layer is partially crystallized.

Alternatively, as described below, the impurity ions may be doped and activated after forming a gate electrode.

Figure 1D:
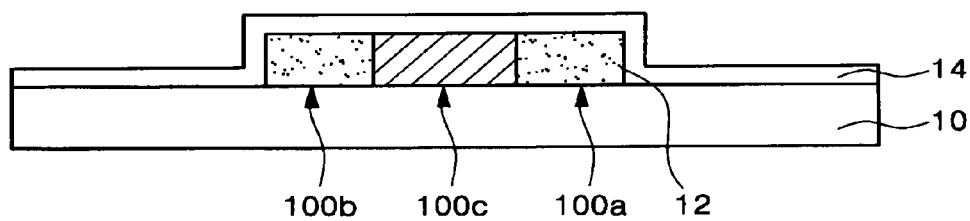
Figure 1E:
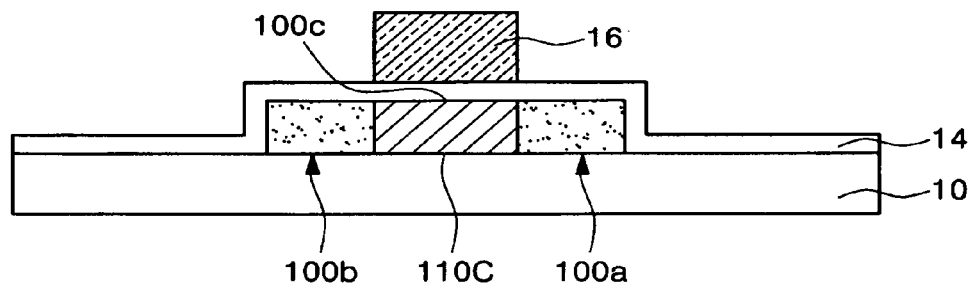

Then, as shown in FIG. 1D, a gate insulating layer 14 of $SiO_2$ or SiNx is formed on the polycrystalline silicon layer 12a. Then, as shown in FIG. 1E, the gate electrode 16 is formed corresponding to an active channel region 100c of the polycrystalline silicon layer 12a.

Meanwhile, when the impurity ions are not doped into the amorphous silicon layer, the amorphous silicon layer is doped with the impurity ions using the gate electrode 16 as a mask, thereby forming source and drain regions 100a, 100b and activating the impurity ions by the annealing process.

FIGS. 2A to 2E sequentially illustrate a method of fabricating a semiconductor device according to a second embodiment of the present invention.

Figure 2A:
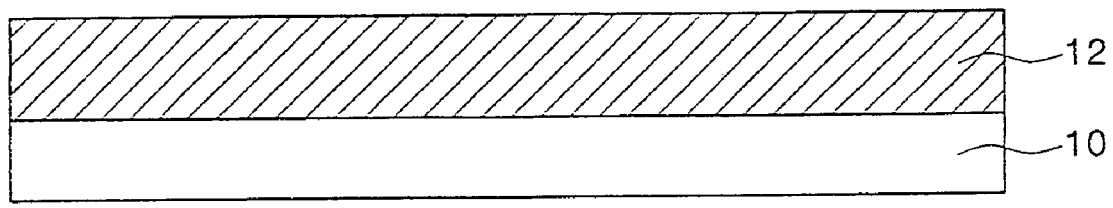
FIGS. 2A to 2E sequentially illustrate a method of fabricating a semiconductor device according to a second embodiment of the present invention.
Figure 2B:
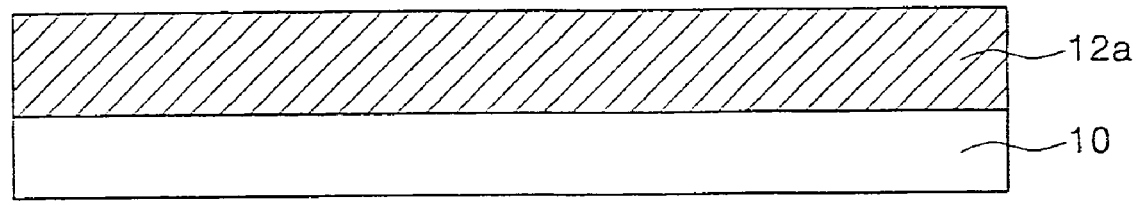
Figure 2C:
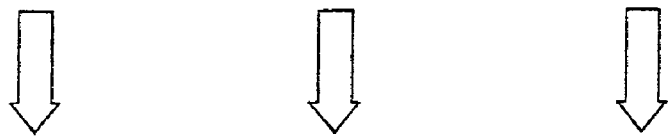
Figure 2C:
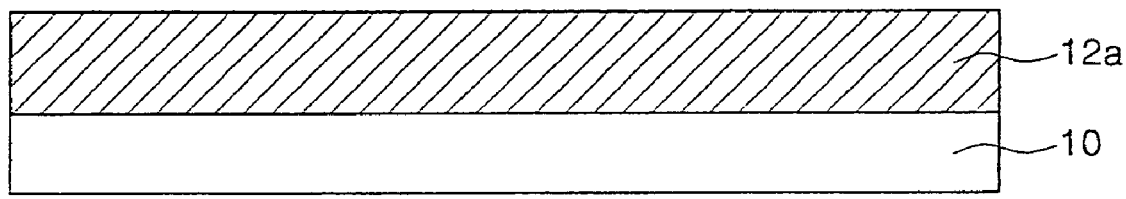
Figure 2D:
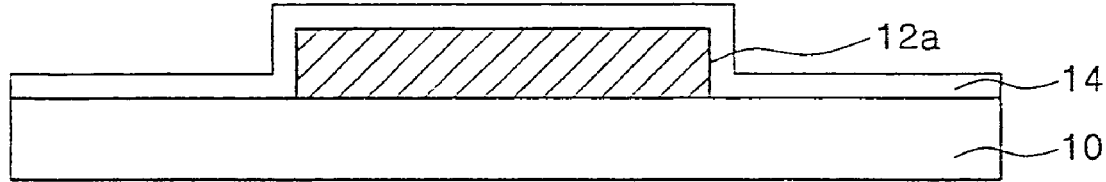
Figure 2E:
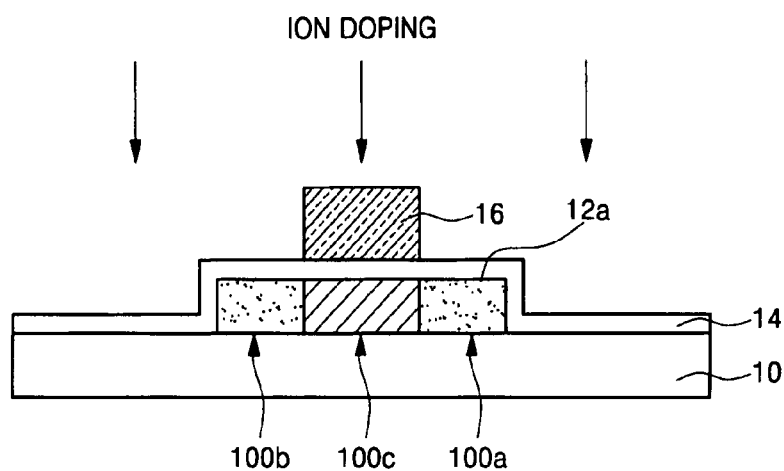

Referring to FIGS. 2A to 2E, in the second embodiment of the present invention, a silicon layer 12 comprising amorphous silicon is deposited on a substrate (referring to FIG. 2A). Then, the silicon layer 12 is annealed under an atmosphere of $H_2O$ at a predetermined temperature, thereby crystallizing the amorphous silicon into a polycrystalline silicon layer 12a (refer to FIG. 2B). The crystallized polycrystalline silicon layer 12a is then annealed by the laser to crystallize the non-crystallized amorphous silicon and recrystallize the polycrystalline silicon (refer to FIG. 2C). Then, the polycrystalline silicon layer 12a is patterned and a gate insulating layer 14 is formed on the polycrystalline silicon layer 12a (refer to FIG. 2D). Sequentially, the polycrystalline silicon layer 12a is doped with impurity ions to define source and drain regions 100a and 100b, and the source and drain regions 100a and 100b are annealed to activate the impurity ions (refer to FIG. 2E).

According to the second embodiment, the process of annealing the silicon layer 12 under an atmosphere of $H_2O$ at a predetermined temperature is performed like the first embodiment. Also, the laser annealing process is performed like the first embodiment.

However, as compared with the first embodiment, the polycrystalline silicon layer 12a is annealed under the atmosphere of $H_2O$, and then is annealed once more by the laser, thereby enhancing the crystallinity of the polycrystalline silicon layer 12a.

Here, an N-type semiconductor device and a P-type semiconductor device may be defined according to the doped impurity ions.

The subsequent processes such as forming a gate electrode 16 are performed equally to those of the first embodiment.

The polycrystalline silicon thin layer of the semiconductor device fabricated by the foregoing method has a Raman spectrum FWHM of 7.5 $cm^{-1}$ or below, and preferably ranges from 4.5 $cm^{-1}$ to 6.8 $cm^{-1}$, thereby having excellent crystallinity.

The semiconductor device fabricated by the foregoing methods includes an N-type or P-type thin film transistor, and is used for an organic light emitting display or a liquid crystal display (LCD).

Hereinbelow, examples according to an embodiment of the present invention will be described, wherein the following examples are offered just to help understanding of the present invention but not limited thereto.

EXAMPLES 1 TO 3

An amorphous silicon layer was deposited to a thickness of 500 Å on a substrate. As the deposition method, a low pressure chemical vapor deposition (LPCVD) method was used in Example 1, a plasma enhanced chemical vapor deposition (PECVD) method containing 2% or less of hydrogen was used in Example 2, and a plasma enhanced chemical vapor deposition (PECVD) method containing 10% or more of hydrogen was used in Example 3. P-type ions are then doped onto the entire surface of the amorphous silicon layer.

Then, the amorphous silicon layer was annealed and crystallized using a rapid thermal annealing (RTA) process at a temperature of about 710° C. for 10 minutes, 5 minutes and 8 minutes or less, respectively. This annealing process was performed with a carrier gas of $O_2$ or $N_2$ under an atmosphere of $H_2O$. Subsequently, the laser annealing was performed to activate the impurity ions, and at the same time to crystallize the amorphous silicon remaining in the polycrystalline silicon and recrystallize the crystallized polycrystalline silicon, wherein the laser had an energy density of 230, 250, 270, 290 and 310 $mJ/cm^2$.

Then, the polycrystalline silicon layer was patterned, and subsequently a gate insulating layer of SiNx was formed over the entire surface of the substrate having the patterned polycrystalline silicon layer. Then, a gate electrode was formed corresponding to an active channel region, and N-type ions was doped at a high concentration thereinto.

Then, an interlayer insulating layer was formed, and contact holes were formed to open source and drain regions. The contact holes were filled with metal to form source and drain electrodes, thereby completing the thin film transistor.

Figure 3:
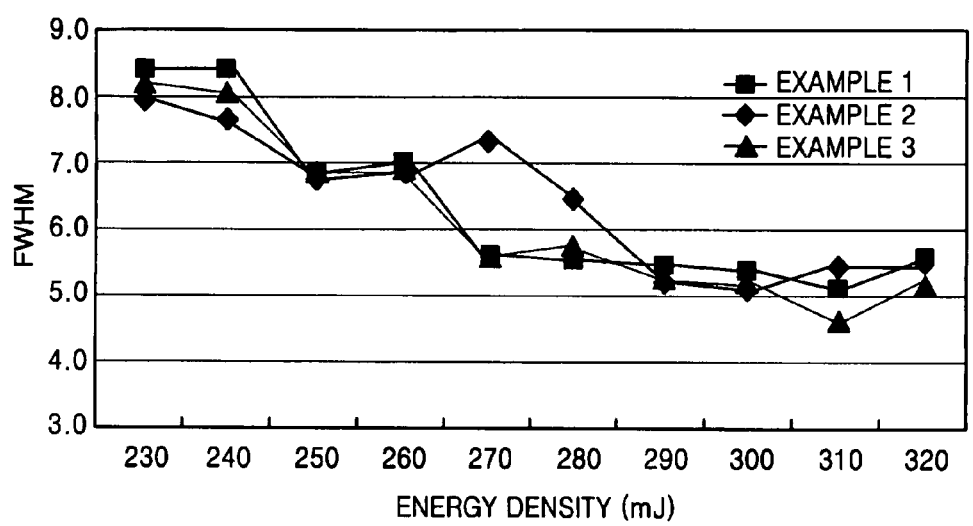
FIG. 3 is a graph showing full-width-half-maximum (FWHM) of polycrystalline silicon thin layers fabricated according to embodiments of the present invention.

In FIG. 3, a Raman spectrum of the polycrystalline silicon according to the examples was shown.

COMPARATIVE EXAMPLES 1 TO 3

The comparative examples 1 to 3 were performed under the same condition as the examples 1 to 3 except that the annealing process is performed with a carrier gas of $N_2$ or $O_2$ under an atmosphere of $N_2$. At this time, in order to entirely crystallize the amorphous silicon, the annealing time was the same as that of the examples 1 to 3, but the annealing temperature was increased to 740° C.

Referring to FIG. 3, the polycrystalline silicon based on the examples 1 to 3 had a Raman peak of full-width-half-maximums (FWHM) ranging from 5.0 to 8.0 $cm^{-1}$, which has excellent in crystallinity.

Thus, the polycrystalline silicon is annealed once more while the impurity ions are activated, thereby contributing the crystallization of the amorphous silicon. For reference, the polycrystalline silicon, crystallized by the annealing process under an inactive atmosphere, has an FWHM of 8.0 $cm^{-1}$ or more.

Further, the polycrystalline silicon thin layer according to the present invention may be applied to a thin film transistor, and the thin film transistor may be used for an organic light emitting display or a liquid crystal display.

As described above, since the amorphous silicon is annealed and crystallized under the atmosphere of $H_2O$ using an SPC process and recrystallized by a laser annealing process, it is possible to enhance crystallinity and prevent the substrate from being bent.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating a semiconductor device, comprising:
    depositing a silicon layer containing amorphous silicon on a substrate;
    partially crystallizing the amorphous silicon layer by applying an annealing process to the silicon layer under an atmosphere of $H_2O$ at a predetermined temperature, wherein the $H_2O$ pressure ranges from 10,000 Pa to 2 Mpa, with a non-crystallization percentage of the amorphous silicon layer ranging from 20% to 70% with respect to the total amorphous silicon layer;
    forming a polycrystalline silicon layer by applying an laser annealing process to the partially crystallized amorphous silicon layer;

forming a gate insulating layer on the polycrystalline silicon layer; and forming a gate electrode on the gate insulating layer.

2. The method according to claim 1, wherein the non-crystallization percentage of the amorphous silicon layer ranges from 30% to 60% with respect to the total amorphous silicon layer.

3. The method according to claim 1, further comprising implanting impurity ions into source and drain regions after depositing the amorphous silicon layer.

4. The method according to claim 3, wherein the impurity ions implanted into the source and drain regions are activated while the amorphous silicon layer is partially crystallized.

5. The method according to claim 1, further comprising:
   implanting impurity ions into source and drain regions after forming the gate electrode, and
   activating the impurity ions by the annealing process.

6. The method according to claim 1, wherein the temperature ranges from 550° C. to 750° C.

7. The method according to claim 6, wherein the temperature ranges from 600° C. to 710° C.

8. The method according to claim 1, wherein the silicon layer has a thickness of 2,000 Å or less.

9. The method according to claim 8, wherein the silicon layer has a thickness of 300 Å to 1,000 Å.

10. The method according to claim 1, wherein the laser annealing process includes an excimer laser annealing (ELA) process.

11. The method according to claim 10, wherein the ELA process uses a laser beam having an energy density of 200 mJ/cm$^2$ or more.

12. The method according to claim 11, wherein the energy density ranges from 200 mJ/cm$^2$ to 350 mJ/cm$^2$.

13. A method of fabricating a semiconductor device, comprising:
   depositing a silicon layer containing amorphous silicon on a substrate;
   forming a polycrystalline silicon layer by crystallizing the amorphous silicon into polycrystalline silicon through an annealing process performed under an atmosphere of $H_2O$ at a predetermined temperature, wherein the $H_2O$ pressure ranges from 10,000 Pa to 2 Mpa, with a non-crystallization percentage of the amorphous silicon layer ranging from 20% to 70% with respect to the total amorphous silicon layer;
   recrystallizing the polycrystalline silicon layer by applying a laser annealing process; and
   forming an impurity region on the polycrystalline silicon layer.

14. The method according to claim 13, wherein the temperature ranges from 550° C. to 750° C.

15. The method according to claim 14, wherein the temperature ranges from 600° C. to 710° C.

16. The method according to claim 13, wherein the silicon layer has a thickness of 2,000 Å or less.

17. The method according to claim 16, wherein the silicon layer has a thickness of 300 Å to 1,000 Å.

18. The method according to claim 13, wherein the laser annealing process includes an excimer laser annealing (ELA) process.

19. The method according to claim 18, wherein the ELA process uses a laser beam having an energy density of 200 mJ/cm$^2$ or more.

20. The method according to claim 19, wherein the energy density ranges from 200 mJ/cm$^2$ to 350 mJ/cm$^2$.

* * * * *